(12) United States Patent
Ogihara et al.

(10) Patent No.: US 9,524,863 B2
(45) Date of Patent: Dec. 20, 2016

(54) METHOD FOR CLEANING AND DRYING SEMICONDUCTOR SUBSTRATE

(71) Applicant: SHIN-ETSU CHEMICAL CO., LTD., Tokyo (JP)

(72) Inventors: Tsutomu Ogihara, Jyoetsu (JP); Takeshi Nagata, Jyoetsu (JP); Jun Hatakeyama, Jyoetsu (JP); Daisuke Kori, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 92 days.

(21) Appl. No.: 14/572,867

(22) Filed: Dec. 17, 2014

(65) Prior Publication Data

US 2015/0221500 A1 Aug. 6, 2015

(30) Foreign Application Priority Data

Feb. 6, 2014 (JP) .................................. 2014-21191

(51) Int. Cl.
 *B08B 7/00* (2006.01)
 *H01L 21/02* (2006.01)
 (Continued)

(52) U.S. Cl.
 CPC ........... *H01L 21/02068* (2013.01); *B08B 3/08* (2013.01); *B81C 1/00912* (2013.01); *C08G 4/00* (2013.01);
 (Continued)

(58) Field of Classification Search
 None
 See application file for complete search history.

(56) References Cited

U.S. PATENT DOCUMENTS 3,918,997 A * 11/1975 Mohsen .................. H01L 21/00
 148/DIG. 122
6,776,171 B2 * 8/2004 Carpenter ............. B08B 7/0014
 134/1
(Continued)

FOREIGN PATENT DOCUMENTS

JP A-1-140728 6/1989
JP A-6-310486 11/1994
(Continued)

OTHER PUBLICATIONS

Moreau, Semiconductor Lithography, 1988, Plenum Press, ISBN page, Fig. 1-1-2, p. 16, Fig. 1-4-1, excerpt from 13. Subtractive Etching.*

(Continued)

*Primary Examiner* — Binh X Tran
*Assistant Examiner* — David Cathey, Jr.
(74) *Attorney, Agent, or Firm* — Oliff PLC

(57) ABSTRACT

The present invention provides a method for cleaning and drying a semiconductor substrate in which a semiconductor substrate onto which a pattern has been formed is cleaned and dried, which comprises steps of (1) cleaning the semiconductor substrate onto which a pattern has been formed with a cleaning solution, (2) substituting the cleaning solution with a composition solution containing a resin (A) which is decomposed by either or both of an acid and heat, and (3) decomposing and removing the resin (A) by either or both of an acid and heat. There can be provided a method for cleaning and drying a semiconductor substrate in which pattern falling or collapse occurring at the time of drying the cleaning solution after cleaning the substrate can be suppressed, and the cleaning solution can be efficiently removed, without using a specific apparatus which handles a supercritical state cleaning solution.

20 Claims, 2 Drawing Sheets

(51) Int. Cl.
*B08B 3/08* (2006.01)
*B81C 1/00* (2006.01)
*C08G 4/00* (2006.01)
*G03F 7/40* (2006.01)

(52) U.S. Cl.
CPC .......... *G03F 7/40* (2013.01); *H01L 21/02057* (2013.01); *Y02P 20/544* (2015.11)

(56) References Cited

U.S. PATENT DOCUMENTS

| | | | |
|---|---|---|---|
| 8,206,893 B2* | 6/2012 | Xu | G03F 7/091 |
| | | | 430/271.1 |
| 2004/0005785 A1* | 1/2004 | Bollinger | H01L 21/223 |
| | | | 438/710 |
| 2008/0066337 A1 | 3/2008 | Seki | |
| 2013/0302990 A1 | 11/2013 | Watanabe et al. | |
| 2014/0338698 A1* | 11/2014 | Humphrey | B08B 7/0028 |
| | | | 134/6 |

FOREIGN PATENT DOCUMENTS

| | | |
|---|---|---|
| JP | A-7-70599 | 3/1995 |
| JP | A-2005-72568 | 3/2005 |
| JP | A-2007-199653 | 8/2007 |
| JP | A-2008-98616 | 4/2008 |
| WO | 2012/006139 A2 | 1/2012 |

OTHER PUBLICATIONS

Jun. 10, 2015 extended Search Report issued in European Application No. 14004365.4.

* cited by examiner

METHOD FOR CLEANING AND DRYING SEMICONDUCTOR SUBSTRATE

BACKGROUND OF THE INVENTION

Field of the Invention

The present invention relates to a method for cleaning and drying a semiconductor substrate onto which a pattern has been formed.

Description of the Related Art

In 1980's, light exposure using a g-beam (436 nm) or an i-beam (365 nm) of a mercury lamp has widely been used for resist patterning. As a means for further finer patterning, a method for shifting to a shorter wavelength of exposure has been considered to be effective, so that in a mass-production process after a DRAM (dynamic random access memory) of a 64M bit (work size is 0.25 µm or less) in 1990's, a KrF excimer laser (248 nm) at a shorter wavelength was used as an exposure light source instead of the i-beam (365 nm). However, in production of DRAMs at integration degrees of 256M and 1 G or higher which require a finer processing technique (work size is 0.2 µm or less), light sources at a shorter wavelength were required, thereby a photolithography using an ArF excimer laser (193 nm) has been earnestly investigated in the past ten years. At first, the ArF lithography was intended to be firstly applied to a device fabrication of a 180 nm node device, but the KrF excimer lithography was prolonged in life to a mass-production of a 130 nm node device, so that the ArF lithography was firstly and fully applied to a 90 nm node. Further, such a technique was combined with a lens having an NA increased to as great as 0.9, thereby conducting a mass-production of a 65 nm node device. For the next 45 nm node device, further shortening of a wavelength of the exposure light was progressing and the $F_2$ lithography with a wavelength of 157 nm was considered to be a candidate. However, development of the $F_2$ lithography has stopped due to various problems such as an increased cost of a scanner since an expensive $CaF_2$ single crystal is used for a projection lens with a large amount, an optical system shall be changed accompanying with introduction of a hard pellicle instead of a soft pellicle having extremely low durability, etching resistance of the resist film is lowered, etc., whereby an ArF liquid immersion lithography has been introduced.

In the ArF liquid immersion lithography, water having a refractive index of 1.44 was introduced between a projection lens and a wafer by a partial fill method, thereby enabling a high-speed scanning to conduct mass-production of a 45 nm node device by means of a lens having an NA of about 1.3.

As a lithography technology for 32 nm node, an extreme ultraviolet (EUV) lithography with a wavelength of 13.5 nm has been mentioned as a candidate. As problems of the EUV lithography, there may be mentioned a laser to be increased in output, a resist film to be increased in higher sensitivity, a resolution to be enhanced, a line edge roughness (LER) to be lowered, a defect-free MoSi laminated mask to be used, reflective mirror aberrations to be lowered, etc., whereby the problems to be overcome are piled up. Thus, in the light exposure used as a general-purpose technique, it is approaching the essential limit of the resolution derived from the wavelength of the light sources.

Even under such a circumstance, high integration of a semiconductor apparatus has advanced, and not only improvement in the integration degree using a planar miniaturization by the above-mentioned light exposure, but also the structure of a three-dimensional semiconductor apparatus is beginning to be proposed. Therefore, the degree of substrate processing in the manufacturing process of a semiconductor apparatus is increased than before, and it has been processed to a substrate (hereinafter referred to as "high aspect substrate") onto which finer and deeper pattern had been formed.

Such a processing substrate is generally processed by dry etching, and a cleaning and drying step is essential to remove fine particles or contamination, etc., generating in the processing steps from the surface of the substrate to clean the same. In particular, drying step is extremely important to prevent from pattern falling or pattern collapse of the processed substrate, and, for example, it has been proposed a method in which a water component used for cleaning the substrate is removed by using a centrifugal force, or drying after substituted by isopropyl alcohol (Patent Documents 1 and 2), and a method for using various kinds of fluorine compounds (Patent Documents 3 and 4), etc.

However, when such methods are used in the high aspect substrate in recent years, there occurs the problems that falling or collapse of the pattern is occurred at the time of drying, or drying of the cleaning solution is insufficient and water mark, etc., is generated.

Also, as the other methods, a method in which the substrate is cleaned by a supercritical state cleaning solution to prevent from occurring pattern collapse has been proposed (Patent Document 5), but according to this method, a specific apparatus for handling the supercritical state cleaning solution is required, so that there is a problem that the costs become expensive.

PRIOR ART DOCUMENTS

Patent Documents

Patent Document 1: Japanese Patent Laid-Open Publication No. H01-140728
Patent Document 2: Japanese Patent Laid-Open Publication No. H06-310486
Patent Document 3: Japanese Patent Laid-Open Publication No. H07-070599
Patent Document 4: Japanese Patent Laid-Open Publication No. 2008-098616
Patent Document 5: Japanese Patent Laid-Open Publication No. 2005-072568

SUMMARY OF THE INVENTION

The present invention has been accomplished in view of the above-mentioned circumstances and an object thereof is to provide a method for cleaning and drying a semiconductor substrate in which pattern falling or collapse occurring at the time of drying the cleaning solution after cleaning the substrate can be suppressed, and the cleaning solution can be efficiently removed, without using a specific apparatus which handles a supercritical state cleaning solution.

To solve the above-mentioned problems, the present invention provides a method for cleaning and drying a semiconductor substrate in which a semiconductor substrate onto which a pattern has been formed is cleaned and dried, which comprises the steps of (1) cleaning the semiconductor substrate onto which a pattern has been formed with a cleaning solution, (2) substituting the cleaning solution with a composition solution containing a resin (A) which is decomposed by either or both of an acid and heat, and (3) decomposing and removing the resin (A) by either or both of an acid and heat.

When such a method for cleaning and drying is employed, pattern falling or collapse generating at the time of drying the cleaning solution after cleaning the substrate can be suppressed, and the cleaning solution can be efficiently removed, without using a specific apparatus which handles a supercritical state cleaning solution.

At this time, the above-mentioned resin (A) preferably contains a repeating unit having an acetal structure represented by the following general formula (1),

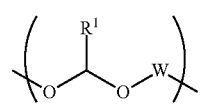
(1)

wherein $R^1$ represents a hydrogen atom, or a saturated or unsaturated monovalent organic group having 1 to 30 carbon atoms which may be optionally substituted; and W represents a saturated or unsaturated divalent organic group having 2 to 30 carbon atoms.

When such a resin (A) is employed, the resin has heat decomposability and fluidity, and decomposed to a low molecular weight compound having high volatility by heat decomposition, so that it can be suitably used in the present invention.

At this time, the above-mentioned resin (A) preferably comprises a compound represented by any of the following general formulae (1a) to (1c),

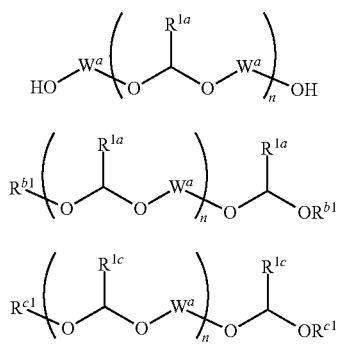

wherein $R^{1a}$ represents an alkyl group having 1 to 4 carbon atoms; $W^a$ represents a saturated or unsaturated divalent hydrocarbon group having 4 to 10 carbon atoms which may contain an ether bond(s); each $R^{b1}$ independently represents —$W^a$—OH, or a saturated or unsaturated monovalent organic group having 1 to 30 carbon atoms which may be optionally substituted; $R^{1c}$ represents a hydrogen atom, an aryl group having 6 to 20 carbon atoms which may be optionally substituted, or a heteroaryl group having 4 to 20 carbon atoms which may be optionally substituted; each $R^{c1}$ independently represents an alkyl group having 1 to 4 carbon atoms or —$W^a$—OH; and "n" represents an average number of repeating units and is 3 to 2,000.

When such a resin (A) is employed, the resin has excellent fluidity, and it is easily possible to make the weight loss ratio at the time of heating 70% by mass or more by the selection of the structure of the resin.

At this time, the above-mentioned pattern preferably has an aspect ratio of 10:1 or more.

The method for cleaning and drying of the present invention can effectively suppress falling or collapse of the pattern particularly in the substrate onto which such a pattern with a high aspect ratio has been formed.

At this time, the above-mentioned cleaning solution is preferably a liquid containing one or more of water, a water-soluble alcohol, and a fluorine compound.

The method for cleaning and drying of the present invention can be applied irrespective of the kind of the cleaning solution, and particularly when the method for cleaning and drying of the present invention is applied to drying of such a cleaning solution, falling or collapse of the pattern can be effectively suppressed.

At this time, decomposition and removal of the above-mentioned resin (A) is preferably carried out by heating at 50° C. or higher and 300° C. or lower.

When such a temperature is employed, decomposition and removal of the resin (A) can be surely carried out while suppressing falling or collapse of the pattern.

At this time, after the above-mentioned Step (2), and before the above-mentioned Step (3), a step of (2') removing the solvent in the above-mentioned substituted composition solution is preferably comprised.

By removing the solvent as mentioned above, the resin (A) is solidified to bury the gaps between the patterns, whereby falling or collapse of the pattern can be surely prevented.

As stated above, according to the method for cleaning and drying the semiconductor substrate of the present invention, particularly in a substrate onto which a pattern with a high aspect ratio of 10:1 or more has been formed, falling or collapse of the pattern occurring at the time of drying the cleaning solution after cleaning the substrate can be effectively suppressed, and the cleaning solution can be efficiently removed, without using a specific apparatus such as a supercritical cleaning. As a result, a semiconductor substrate in which there is neither falling nor collapse of the pattern and fine particles or stain has been removed by cleaning can be obtained.

DETAILED DESCRIPTION OF THE PREFERRED EMBODIMENTS

Figure 1:
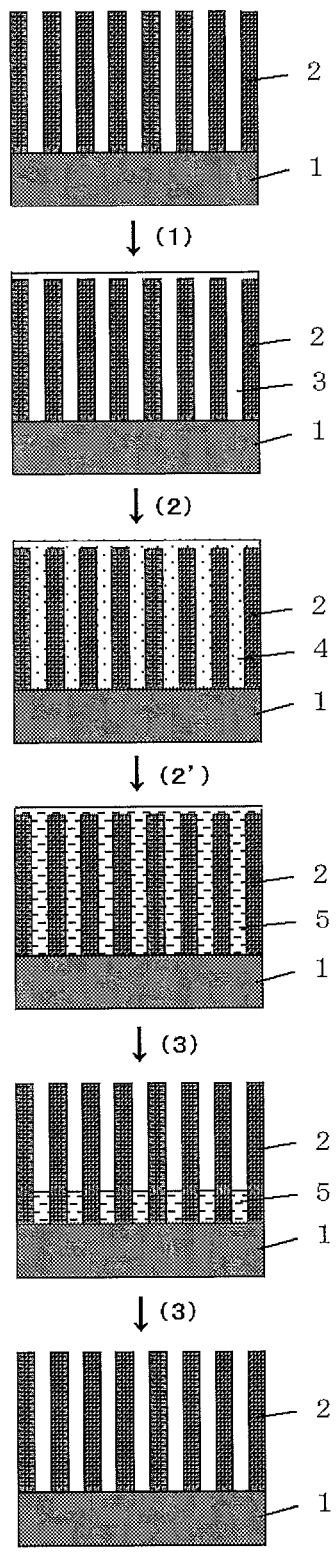
FIG. 1 is a flow chart showing an example of the method for cleaning and drying a semiconductor substrate of the present invention.

As mentioned above, it has been desired to develop a method for cleaning and drying a semiconductor substrate which can suppress falling or collapse of the substrate structure (pattern) occurring at the time of drying the cleaning solution after cleaning the substrate and can remove the cleaning solution efficiently, without using a specific apparatus in the cleaning using a supercritical state cleaning solution.

The present inventors have intensively studied to solve the above-mentioned problems, and as a result, they have found out that if a method in which the cleaning solution is removed not directly by drying but by substituting the cleaning solution with a polymer compound which is decomposed by either or both of an acid and heat, and then, the polymer compound is decomposed and removed by addition of an acid or heating, etc., is employed, deformation and collapse of the structure by a stress to the substrate structure generating at the time of drying can be prevented by filling the polymer compound between the gaps of the substrate structure, and finally, falling or collapse of the substrate structure is suppressed by removing the solidified polymer compound by vaporizing, and the cleaning solution can be efficiently removed, whereby they have accomplished the present invention.

The present invention provides a method for cleaning and drying a semiconductor substrate in which a semiconductor substrate onto which a pattern has been formed is cleaned and dried, which comprises steps of (1) cleaning the semiconductor substrate onto which a pattern has been formed with a cleaning solution, (2) substituting the cleaning solution with a composition solution containing a resin (A) which is decomposed by either or both of an acid and heat, and (3) decomposing and removing the resin (A) by either or both of an acid and heat.

In the following, the present invention is explained in detail, but the present invention is not limited by these.
<Resin (A)>

First, the resin (A) to be used in the method for cleaning and drying the semiconductor substrate of the present invention is explained.

The resin (A) is a resin which is decomposed by either or both of an acid and heat. In the following, the resin (A) which is decomposed by heat may be sometimes referred to as a "heat-decomposable polymer".

Incidentally, as the resin (A), those decomposed by an acid, or those decomposed by both of an acid and heat as mentioned above may be used.

[Heat-Decomposable Polymer]

Preferred embodiments of the heat-decomposable polymer to be used in the method for cleaning and drying of the present invention, there may be mentioned a compound containing a repeating unit having an acetal structure represented by the following general formula (1) (in the following, it is sometimes referred to "heat-decomposable polymer (1)"),

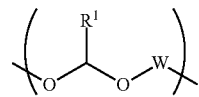
(1)

wherein $R^1$ represents a hydrogen atom, or a saturated or unsaturated monovalent organic group having 1 to 30 carbon atoms which may be optionally substituted; and W represents a saturated or unsaturated divalent organic group having 2 to 30 carbon atoms.

In the above-mentioned general formula (1), $R^1$ represents a hydrogen atom, or a saturated or unsaturated monovalent organic group having 1 to 30 carbon atoms which may be optionally substituted.

Here, in the present invention, the terms "an organic group" mean a group containing at least one carbon atom, which further contain a hydrogen atom(s), and nitrogen, oxygen, sulfur, silicon, a halogen atom, etc., may be further contained.

$R^1$ may be a single kind, or a plural number of species may be mixed. $R^1$ may be more specifically exemplified by a hydrogen atom, a methyl group, an ethyl group, a vinyl group, a 2,2,2-trifluoroethyl group, a propyl group, an isopropyl group, an allyl group, 1-propenyl group, an isopropenyl group, a butyl group, a s-butyl group, a t-butyl group, an isobutyl group, a pentyl group, a cyclopentyl group, a hexyl group, a cyclohexyl group, a cyclohexenyl group, a decyl group, a dodecyl group, an eicosyl group, a norbornyl group, an adamantyl group, a phenyl group, a toluyl group, a xylyl group, a naphthyl group, a phenanthrenyl group, an anthrathenyl group, a benzyl group, a fluorenyl group, a naphthylmethyl group, a norbornenyl group, a triacontyl group, a 2-furanyl group, a 2-tetrahydrofuranyl group, etc.

In the above-mentioned general formula (1), W represents a saturated or unsaturated divalent organic group having 2 to 30 carbon atoms. W may be a single kind, or a plural number of species may be mixed. W may be more specifically exemplified by an ethylene group, a propylene group, a butylene group, a trimethylene group, a tetramethylene group, a pentamethylene group, a hexamethylene group, a heptamethylene group, an octamethylene group, a decamethylene group, a dodecamethylene group, an eicosamethylene group, a triacontamethylene group, a cyclopentanediyl group, a cyclohexanediyl group, a dimethylcyclohexanediyl group, a 2-butene-1,4-diyl group, a 2,4-hexadiene-1,6-diyl group, a 3-oxapentane-1,5-diyl group, a 3,6-dioxaoctane-1,8-diyl group, a 3,6,9-trioxaundecane-1,11-diyl group, a phenylene group, a xylyl group, a naphthalenediyl group, a dimethylnaphthalenediyl group, an adamantanediyl group, etc.

When the heat-decomposable polymer contains a repeating unit having an acetal structure represented by the above-mentioned general formula (1), it may have a single repeating unit alone, or may have two or more kinds of the repeating units in combination.

The repeating unit having an acetal structure represented by the above-mentioned general formula (1) may be specifically exemplified by the following, but is not limited by these.

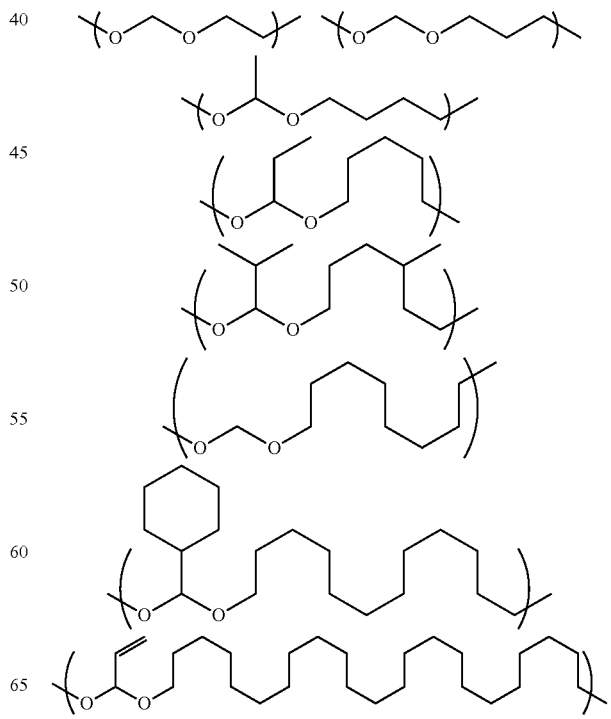

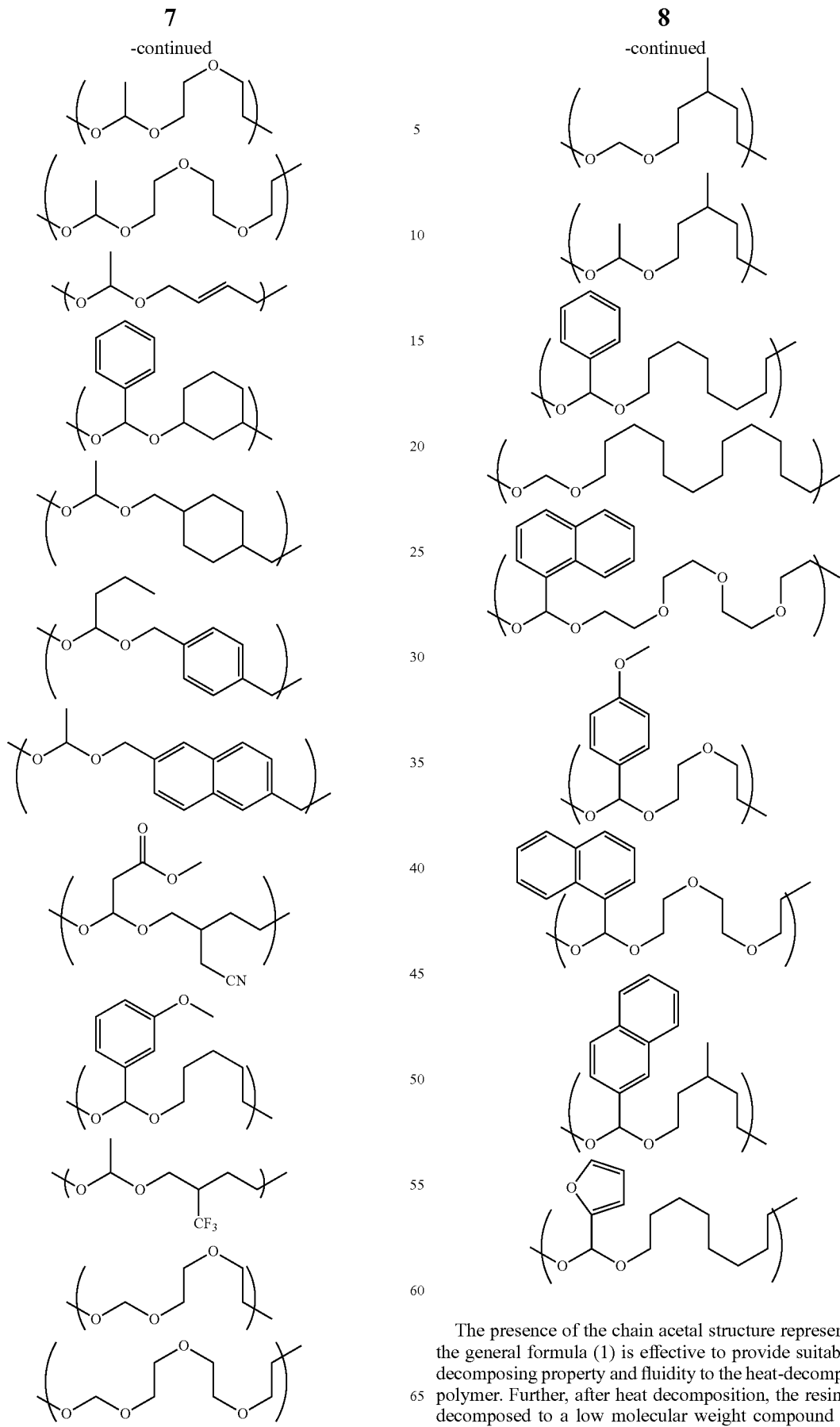
The presence of the chain acetal structure represented by the general formula (1) is effective to provide suitable heat decomposing property and fluidity to the heat-decomposable polymer. Further, after heat decomposition, the resin (A) is decomposed to a low molecular weight compound having high volatility, so that it can be removed without applying its stress to the substrate. That is, the resin is vaporized directly from a solid (a polymer) without via a liquid, so that the surface tension does not work for the substrate structure as in the supercritical cleaning technology, whereby collapse of the substrate structure can be prevented.

Moreover, the preferred embodiment of the above-mentioned heat-decomposable polymer (1) may be mentioned a compound represented by any of the following general formulae (1a) to (1c) (in the following, these may be sometimes referred to as "heat-decomposable polymers (1a) to (1c)"),

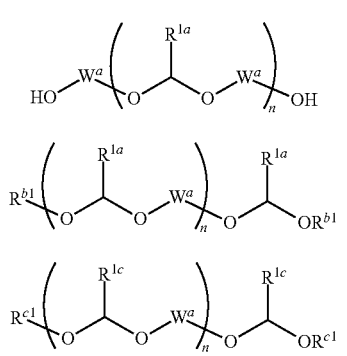

wherein $R^{1a}$ represents an alkyl group having 1 to 4 carbon atoms; $W^a$ represents a saturated or unsaturated divalent hydrocarbon group having 4 to 10 carbon atoms which may contain an ether bond(s); each $R^{b1}$ independently represents $—W^a—OH$, or a saturated or unsaturated monovalent organic group having 1 to 30 carbon atoms which may be optionally substituted; $R^{1c}$ represents a hydrogen atom, an aryl group having 6 to 20 carbon atoms which may be optionally substituted, or a heteroaryl group having 4 to 20 carbon atoms which may be optionally substituted; each $R^{c1}$ independently represents an alkyl group having 1 to 4 carbon atoms or $—W^a—OH$; and "n" represents an average number of repeating units and is 3 to 2,000.

In the above-mentioned general formula (1a) and (1b), $R^{1a}$ represents an alkyl group having 1 to 4 carbon atoms. $R^{1a}$ may be a single kind, or a plural number of species may be mixed. $R^{1a}$ may be specifically exemplified by a methyl group, an ethyl group, a propyl group, an isopropyl group, a butyl group, a s-butyl group, a t-butyl group, an isobutyl group, etc.

In the above-mentioned general formula (1a) to (1c), $W^a$ represents a saturated or unsaturated divalent hydrocarbon group having 4 to 10 carbon atoms which may have an ether bond(s). $W^a$ may be a single kind, or a plural number of species may be mixed. $W^a$ may be specifically exemplified by a tetramethylene group, a pentamethylene group, a hexamethylene group, a heptamethylene group, an octamethylene group, a decamethylene group, a cyclopentanediyl group, a cyclohexanediyl group, a dimethylcyclohexanediyl group, a 2-butene-1,4-diyl group, a 2,4-hexadiene-1,6-diyl group, a 3-oxapentane-1,5-diyl group, a 3,6-dioxaoctane-1,8-diyl group, a 3,6,9-trioxaundecane-1,11-diyl group, a phenylene group, a xylyl group, an adamantanediyl group, etc.

In the above-mentioned general formula (1b), each $R^{b1}$ independently represents $—W^a—OH$, or a saturated or unsaturated monovalent organic group having 1 to 30 carbon atoms which may be optionally substituted; and the saturated or unsaturated monovalent organic group having 1 to 30 carbon atoms which may be optionally substituted may be more specifically exemplified by a methyl group, an ethyl group, a vinyl group, a 2,2,2-trifluoroethyl group, a propyl group, an isopropyl group, an allyl group, 1-propenyl group, an isopropenyl group, a butyl group, a s-butyl group, a t-butyl group, an isobutyl group, a pentyl group, a cyclopentyl group, a hexyl group, a cyclohexyl group, a cyclohexenyl group, a decyl group, a dodecyl group, an eicosanyl group, a norbornyl group, an adamantyl group, a phenyl group, a toluyl group, a xylyl group, a naphthyl group, a phenanthrenyl group, an anthrathenyl group, a benzyl group, a fluorenyl group, a naphthylmethyl group, a norbornenyl group, a triacontyl group, a 2-furanyl group, a 2-tetrahydrofuranyl group, etc.

In the above-mentioned general formula (1c), $R^{1c}$ represents a hydrogen atom, an aryl group having 6 to 20 carbon atoms which may be optionally substituted, or a heteroaryl group having 4 to 20 carbon atoms which may be optionally substituted; $R^{1c}$ may be a single kind, or a plural number of species may be mixed. $R^{1c}$ may be specifically exemplified by a hydrogen atom, a phenyl group, a toluyl group, a xylyl group, a naphthyl group, a phenanthrenyl group, an anthrathenyl group, a 2-furanyl group, an anisyl group, etc.

In the above-mentioned general formula (1c), each $R^{c1}$ independently represents an alkyl group having 1 to 4 carbon atoms or $—W^a—OH$. The alkyl group having 1 to 4 carbon atoms may be specifically exemplified by a methyl group, an ethyl group, a propyl group, an isopropyl group, a butyl group, a s-butyl group, a t-butyl group, an isobutyl group, etc.

"n" represents an average number of repeating units, and is 3 to 2,000, preferably is 3 to 500, and more preferably is 5 to 300.

The compound represented by the above-mentioned general formula (1a) may be specifically exemplified by the following, but is not limited by these. In the following formulae, "n" has the same meaning as defined above.

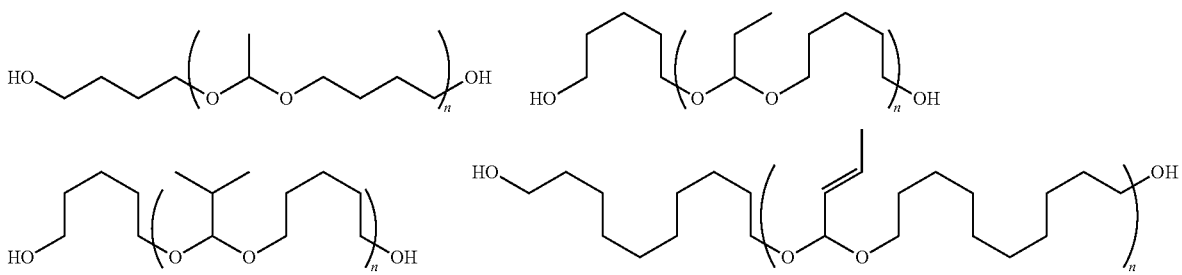

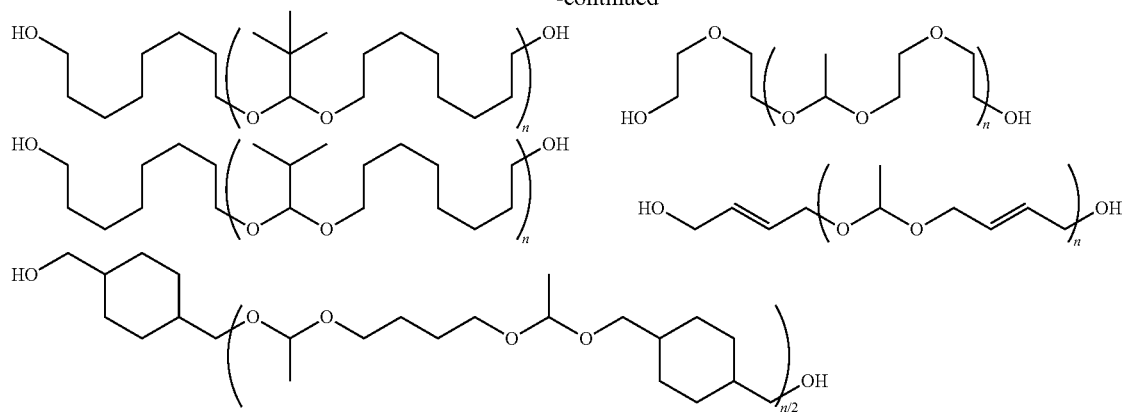

Also, the compound represented by the above-mentioned general formula (1b) may be specifically exemplified by the following, but is not limited by these. In the following formulae, "n" has the same meaning as defined above.

Also, the above-mentioned general formula (1c) may be specifically exemplified by the following, but is not limited by these. In the following formulae, "n" has the same meaning as defined above.

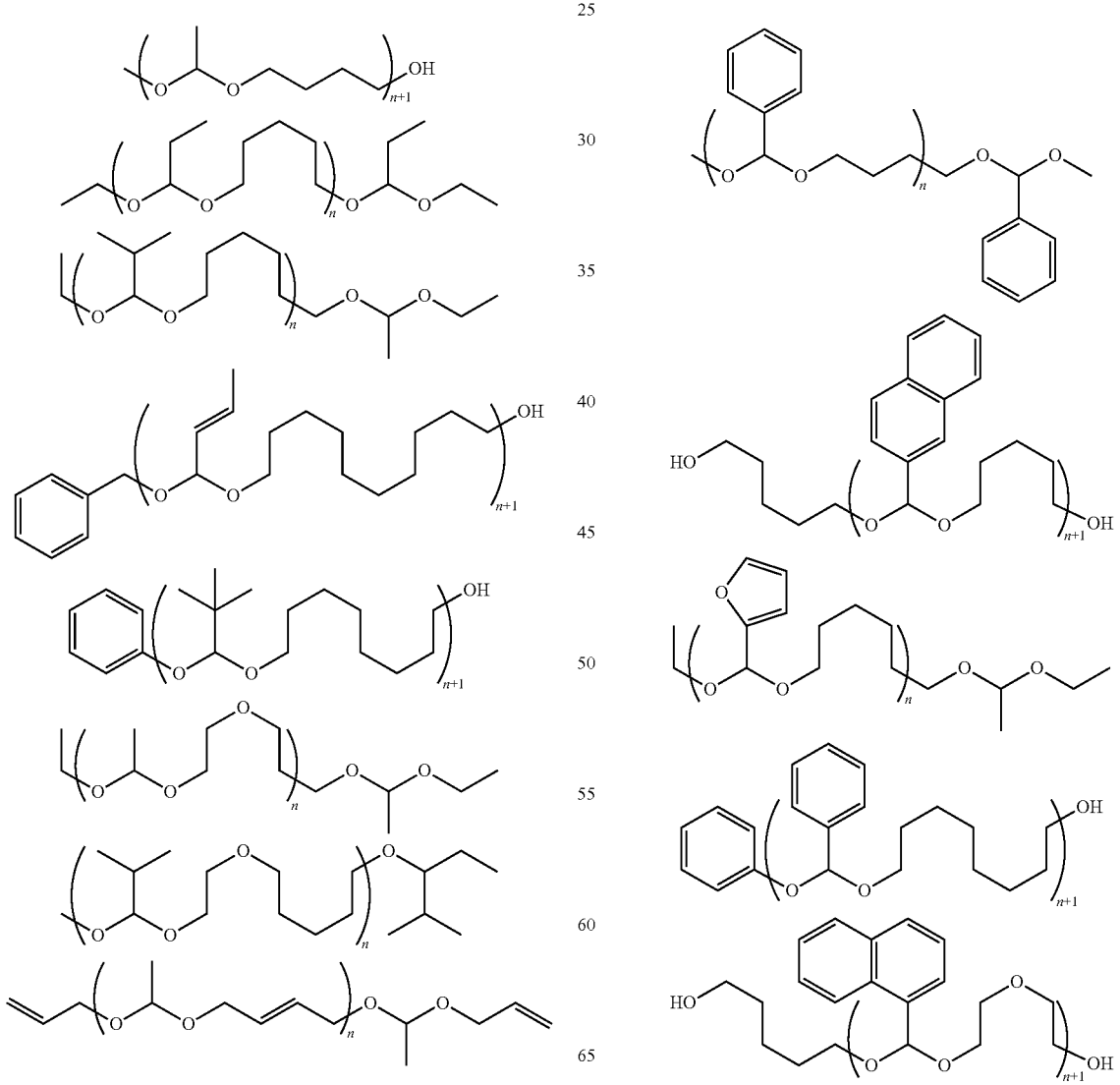

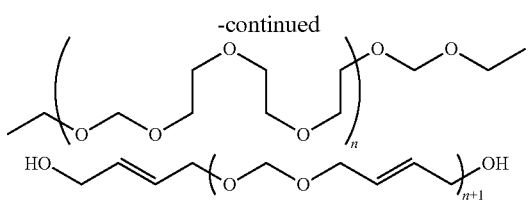

By selecting the structures of $R^1$, $R^{1a}$, $R^{b1}$, $R^{1c}$, $R^{c1}$, $W$ and $W^a$, characteristics of the heat-decomposable polymer such as a heat decomposition temperature, a weight loss ratio at the time of heating, fluidity, etc., can be adjusted as needed.

In particular, the heat-decomposable polymers (1a) to (1c) are excellent in fluidity, and by selecting the structures of $R^{1a}$, $R^{1c}$ and $W^a$, the weight loss ratio at the time of heating can be easily made 70% by mass or more. The heat-decomposable polymers (1a) and (1b) have low heat decomposition temperatures, and as a result, heating temperatures at the time of decomposition and removal can be made low so that they are preferred. The heat-decomposable polymer (1c) also acts as a crosslinking agent in some cases, and the range capable of adjusting the characteristics of the heat-decomposable polymer can be further broadened so that it is preferred.

The weight average molecular weight of the heat-decomposable polymer is preferably 300 to 200,000, more preferably 300 to 50,000, further preferably 500 to 40,000.

If the weight average molecular weight is 300 or more, lowering of blending effects by volatilization, etc., can be suppressed, and sufficient blending effects can be obtained. Also, if the weight average molecular weight is 200,000 or less, fluidity, etc., are not deteriorated, and excellent embedding and planarization characteristics can be achieved.

(Preparation Method of Heat-Decomposable Polymer)

The heat-decomposable polymer having the structure represented by the general formula (1) or (1a) to (1c) can be prepared by selecting the optimum method depending on the structures.

When the heat-decomposable polymer (1a) is exemplified, it can be specifically prepared, for example, by selecting from any of the following three methods. Incidentally, it is also possible to prepare the heat-decomposable polymer (1) other than the heat-decomposable polymer (1a) in the same manner. In addition, the preparation methods of the heat-decomposable polymer to be used in the present invention are not limited by these.

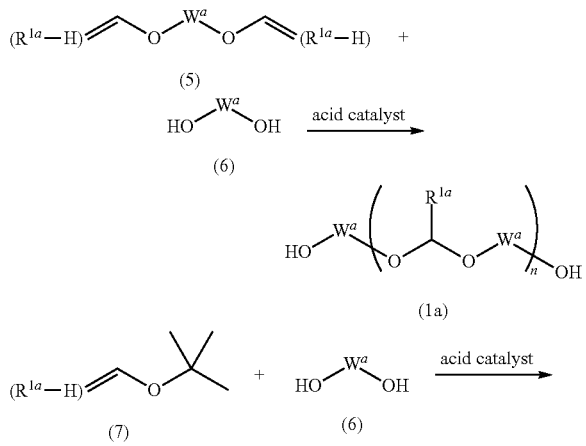

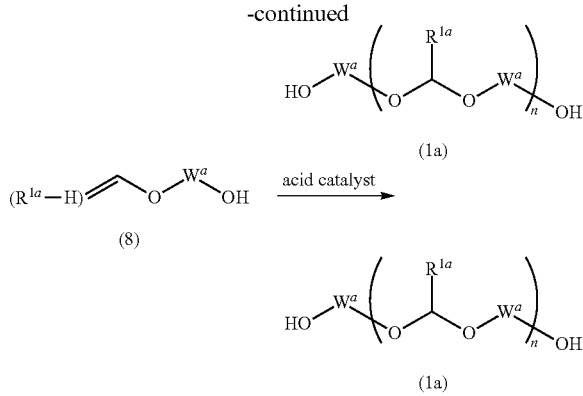

wherein $R^{1a}$, $W^a$ and "n" have the same meanings as defined above.

The above-mentioned reaction is a general acetal formation reaction by an acid catalyst as an elementary reaction. A polymer can be finally obtained by proceeding this elementary reaction repeatedly. In the above-mentioned reaction, an optimum amount of the diol compound (6) to be used to the diether compound (5) is preferably 0.5 mole to 2 mole, in particular 0.8 mole to 1.2 mole, of the diol compound (6) relative to 1 mole of the diether compound (5). In the above-mentioned reaction, an optimum amount of the diol compound (6) to be used to the t-butyl ether compound (7) is preferably 0.5 mole to 2 mole, in particular 0.8 mole to 1.2 mole, of the diol compound (6) relative to 1 mole of the t-butyl ether compound (7).

The above-mentioned acetal formation reaction can be carried out by mixing the respective starting materials with an acid catalyst in a solvent or without the solvent, and cooling or heating the mixture. When a solvent is used in the reaction, the solvent may be selected from aliphatic hydrocarbons such as hexane, heptane, etc.; aromatic hydrocarbons such as toluene, xylene, trimethylbenzene, methylnaphthalene, etc.; ethers such as diethyl ether, dibutyl ether, diethylene glycol diethyl ether, diethylene glycol dimethyl ether, tetrahydrofuran, etc.; ketones such as acetone, 2-butanone, etc.; alcohols such as t-butyl alcohol, t-amyl alcohol, etc.; esters such as ethyl acetate, propylene glycol monomethyl ether acetate, γ-butyrolactone, etc.; nitriles such as acetonitrile, etc.; amides such as N,N-dimethylformamide, N,N-dimethylacetamide, etc.; and halogenated hydrocarbons such as o-dichlorobenzene, methylene chloride, 1,2-dichloroethane, etc. The solvents may be used solely or as a combination of two or more kinds of them.

Various kinds of inorganic acids and organic acids may be used as the acid catalyst to be used in the reaction, and specifically mentioned an acidic catalyst such as hydrochloric acid, nitric acid, sulfuric acid, formic acid, oxalic acid, acetic acid, methanesulfonic acid, camphorsulfonic acid, tosylic acid, trifluoromethanesulfonic acid, cation exchange resin, sodium hydrogen sulfate, pyridinium p-toluenesulfonate, etc. An amount of these acid catalysts to be used is preferably $1 \times 10^{-5}$ to $5 \times 10^{-1}$ mole relative to the total 1 mole of the starting materials.

The reaction temperature is preferably −20° C. to 100° C., more preferably 0° C. to 80° C. When the solvent is used, the boiling point or so of the solvent is preferably set to the upper limit. If the reaction temperature is −20° C. or higher, the reaction proceeds smoothly, while if it is 100° C. or lower, side reactions such as decomposition reaction of the product, etc., can be suppressed.

The reaction time is preferably determined by tracing the progress of the reaction by thin layer chromatography, liquid chromatography, gel filtration chromatography, etc., to improve the yield, and is generally 0.5 to 200 hours or so. After completion of the reaction, the heat-decomposable polymer (1a) which is the objective product can be obtained by the general aqueous system post treatment (aqueous work-up) and/or the filtration treatment of the insoluble components.

The obtained heat-decomposable polymer (1a) may be purified, if necessary, by the conventional method such as liquids separation, crystallization, concentration under reduced pressure, dialysis, ultrafiltration, etc., depending on the characteristics thereof. Also, if necessary, the product may be passed through a commercially available demetallization filter to reduce the metal content therein.

A method for the reaction may be employed, for example, a method in which respective starting materials, an acid catalyst, and a solvent, if necessary, are charged at once, a method in which respective starting materials or a starting material solution is/are added dropwise solely or as a mixture in the presence of a catalyst, or a method in which mixed starting materials or a mixed starting materials solution is/are passed through a column filled with a solid acid catalyst. With regard to adjustment of the molecular weight, it may be carried out, for example, by controlling a reaction time, by controlling an amount of the acid catalyst, by controlling an added/contained ratio of a polymerization terminator such as water, an alcohol, a basic compound, etc., and when two kinds of the starting materials are used, by controlling a ratio of the charged starting materials, or by controlling the above in optional combination.

The starting material compounds represented by the above-mentioned general formulae (5) to (8) may be used each a single kind solely, or may be used two or more kinds in combination. The compounds such as the starting material compounds represented by the above-mentioned general formulae (5), (7) and (8), etc., are unstable to oxygen, light, moisture, etc., in some cases, and in such a case, the reaction is preferably carried out under inert gas atmosphere such as nitrogen, etc., and under shielding light.

Also, the heat-decomposable polymers (1b) and (1c) can be specifically prepared by, for example, the method selecting from the following two methods. Incidentally, it is also possible to prepare the heat-decomposable polymer (1) other than the heat-decomposable polymers (1b) and (1c) in the same manner. In addition, the preparation methods of the heat-decomposable polymer to be used in the present invention are not limited by these.

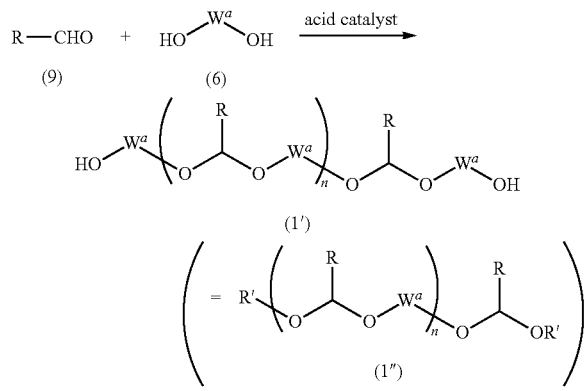

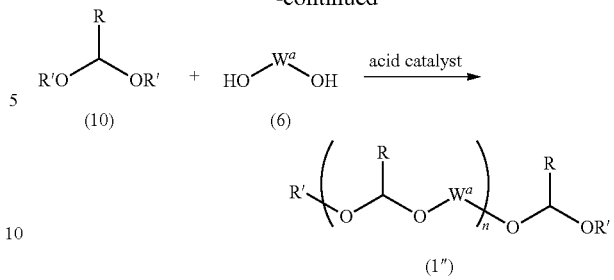

wherein R is $R^{1a}$ or $R^{1c}$; R' is $R^{b1}$ or $R^{c1}$; and $W^a$, $R^{1a}$, $R^{b1}$, $R^{1c}$, $R^{c1}$ and "n" have the same meanings as defined above.

The above-mentioned reaction is a general acetal formation reaction by an acid catalyst as an elementary reaction. A polymer can be finally obtained by proceeding this elementary reaction repeatedly. In the above-mentioned reaction, an optimum amount of the diol compound (6) to be used to the aldehyde compound (9) is preferably 0.5 mole to 2 mole, in particular 0.8 mole to 1.2 mole, of the diol compound (6) relative to 1 mole of the aldehyde compound (9). In the above-mentioned reaction, an optimum amount of the diol compound (6) to be used to the acetal compound (10) is preferably 0.5 mole to 2 mole, in particular 0.8 mole to 1.2 mole, of the diol compound (6) relative to 1 mole of the acetal compound (10).

The above-mentioned acetal formation reaction can be carried out by mixing the respective starting materials with an acid catalyst in a solvent or without the solvent, and cooling or heating the mixture. When a solvent is used in the reaction, the solvent may be mentioned the same as used in the above-mentioned preparation method for the heat-decomposable polymer (1a).

Various kinds of inorganic acids and organic acids may be used as the acid catalyst to be used for the reaction, and specifically mentioned those which are the same as used in the above-mentioned preparation method for the heat-decomposable polymer (1a). Also, an amount of the acid catalyst to be used may be the same as used in the above-mentioned preparation method for the heat-decomposable polymer (1a).

The reaction temperature is preferably 0° C. to 250° C., more preferably 20° C. to 200° C. When the solvent is used, the boiling point or so of the solvent is preferably set to the upper limit. If the reaction temperature is 0° C. or higher, the reaction proceeds smoothly, while if it is 250° C. or lower, side reactions such as decomposition reaction of the product, etc., can be suppressed.

The reaction time is preferably determined by tracing the progress of the reaction by thin layer chromatography, liquid chromatography, gel filtration chromatography, etc., to improve the yield, and is generally 0.5 to 200 hours or so. After completion of the reaction, the heat-decomposable polymer (1″), i.e., the heat-decomposable polymer (1b) or the heat-decomposable polymer (1c) which is the objective product can be obtained by the general aqueous system post treatment (aqueous work-up) and/or the filtration treatment of the insoluble components.

The obtained heat-decomposable polymer (1″) may be purified, if necessary, by the conventional method such as liquids separation, crystallization, concentration under reduced pressure, dialysis, ultrafiltration, etc., depending on the characteristics thereof. Also, if necessary, the product may be passed through a commercially available demetallization filter to reduce the metal content therein.

A method for the reaction may be employed, for example, a method in which respective starting materials, an acid catalyst, and a solvent, if necessary, are charged at once, a method in which respective starting materials or a starting material solution is/are added dropwise solely or as a mixture in the presence of a catalyst, or a method in which mixed starting materials or a mixed starting materials solution is/are passed through a column filled with a solid acid catalyst. The reaction is carried out by distilling off water or an alcohol produced by the reaction, the reaction rate can be improved so that it is preferred. With regard to adjustment of the molecular weight, it may be carried out, for example, by controlling a reaction time, by controlling an amount of the acid catalyst, by controlling an added/contained ratio of a polymerization terminator such as water, an alcohol, a basic compound, etc., by controlling a ratio of the charged starting materials, or by controlling the above in optional combination.

Also, a resin decomposed by an acid, or a resin decomposed by both of an acid and heat may be used as the resin (A). When such a resin (A) is used, a volatile acid may be used at the time of removing the resin (A), but adding an acid generator to the composition solution with the resin (A) is preferable. By adding the acid generator, the resin (A) is not decomposed in the state of the composition solution, and the resin (A) can be decomposed by generating an acid from the acid generator after substituting the cleaning solution, so that the resin (A) can be removed at a lower temperature.

The acid generator to be used in the present invention is preferably a material which generates an acid by heat decomposition, and a material specifically described in the paragraphs (0061) to (0085) of Japanese Patent Laid-Open Publication No. 2007-199653 can be added.

Further, a basic compound may be added to prevent from decomposing the resin (A) by the action of an acid generating from the acid generator at the time of a dark reaction at room temperature, and to improve preservation stability.

As a basic compound may be used, a material specifically described in the paragraphs (0086) to (0090) of Japanese Patent Laid-Open Publication No. 2007-199653 can be added.

<Organic Solvent>

The resin (A) to be used in the method for cleaning and drying the semiconductor substrate of the present invention is used in the state of a composition solution in which the resin is dissolved in an organic solvent. The organic solvent to be used for dissolving the resin (A) is not particularly limited as long as it can dissolve the resin (A).

Such an organic solvent may be specifically exemplified by ketones such as 2-heptanone, cyclopentanone, cyclohexanone, etc.; alcohols such as 3-methoxybutanol, 3-methyl-3-methoxybutanol, 1-methoxy-2-propanol, 1-ethoxy-2-propanol, etc.; ethers such as propylene glycol monomethyl ether, ethylene glycol monomethyl ether, propylene glycol monoethyl ether, ethylene glycol monoethyl ether, propylene glycol dimethyl ether, diethylene glycol dimethyl ether, etc.; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, γ-butyrolactone, propylene glycol mono-tert-butyl ether acetate, etc., and one kind solely or two or more kinds as a mixture may be used, but the organic solvent is not limited by these.

Among these, particularly, propylene glycol monomethyl ether acetate, propylene glycol monomethyl ether, 2-heptanone, cyclopentanone, cyclohexanone, γ-butyrolactone, and a mixture of two or more kinds thereof are preferably used.

A blending amount of the organic solvent is preferably 200 to 10,000 parts by mass, particularly preferably 300 to 5,000 parts by mass relative to 100 parts by mass of the resin (A).

<Substrate>

The substrate to which the method for cleaning and drying of the present invention can be applied is a material having a columnar pattern structure and/or a hole shaped pattern structure onto the surface of the substrate. The columnar pattern structure and/or the hole shaped pattern structure may be rectangular or circular. Also, it may be square prism or columnar each having a cavity at the central part thereof, or may be a rectangular shaped hole or a circular shaped hole each having a pillar at the central part thereof. Further, the pattern structure is not particularly limited, and it may be formed by general dry etching.

As mentioned above, when the conventional method for cleaning and drying is applied to a pattern with a large aspect ratio (a ratio of a height (or a depth)/a short side (or a diameter)), collapse of the pattern is occurred. To the contrary, the method for cleaning and drying of the present invention is particularly effective to a columnar pattern structure and/or a hole shaped pattern structure with a large aspect ratio. The aspect ratio of the pattern to be formed onto the substrate to be used in the method for cleaning and drying of the present invention is preferably 10:1 or more, more preferably 20:1 or more, further preferably 50:1 or more, particularly preferably 70:1 or more.

Further, in the present invention, as a size of a short side (or a diameter) of the columnar pattern and/or a short side (or an inner diameter) of the hole state pattern, it particularly exhibits the effect at 3 to 1,000 nm, further exhibits the effect more markedly at 5 to 500 nm.

The material constituting the substrate structure may be exemplified by a metal film, a metal carbide film, a metal oxide film, a metal nitride film, a metal oxynitride film, or a metal oxynitride film, etc., comprising silicon, titanium, tungsten, hafnium, zirconium, chromium, germanium, copper, aluminum, indium, gallium, arsenic, palladium, iron, tantalum, iridium, molybdenum, or an alloy of these metals, etc.

<Cleaning Solution>

The method for cleaning and drying of the present invention can be applied irrespective of the kind of the cleaning solution, and in particular, it is preferred that a liquid containing one or more of water, a water-soluble alcohol, and a fluorine compound be applied to the method for cleaning and drying of the present invention as a cleaning solution, since falling or collapse of the pattern can be effectively suppressed.

<Method for Cleaning and Drying>

As mentioned above, the method for cleaning and drying a semiconductor substrate of the present invention comprises steps of (1) cleaning the semiconductor substrate onto which a pattern has been formed with a cleaning solution, (2) substituting the cleaning solution with a composition solution containing a resin (A) which is decomposed by either or both of an acid and heat, and (3) decomposing and removing the resin (A) by either or both of an acid and heat.

In the following, the method for cleaning and drying of the present invention is explained in more detail by referring to the drawings, but the method for cleaning and drying of the present invention is not limited by these.

FIG. 1 is a flow chart showing an example of the method for cleaning and drying a semiconductor substrate of the present invention.

In the method for cleaning and drying a semiconductor substrate of the present invention shown in FIG. 1, first, as Step (1), a semiconductor substrate 1 onto which a pattern 2 has been formed is cleaned with a cleaning solution 3. Next, as Step (2), the cleaning solution 3 is substituted by using a composition solution containing a heat-decomposable polymer 4. Then, as Step (2'), an organic solvent in the composition solution containing a heat-decomposable polymer 4 is removed by heating to a temperature at which the heat-decomposable polymer is not decomposed but the organic solvent is volatilized, and gaps between the patterns 2 are filled with a heat-decomposable polymer 5. Finally, as Step (3), the heat-decomposable polymer 5 is decomposed and removed by heating.

In the method for cleaning and drying of the present invention, after cleaning with the cleaning solution, the cleaning solution is thus substituted by a composition solution containing a resin (A), and further the organic solvent in the composition solution is volatilized to bury the gaps between the patterns. According to this procedure, falling or collapse of the pattern can be prevented.

Next, by decomposing and removing the resin (A), it is possible to remove the resin (A) without applying a stress of the resin (A) to the substrate. That is, by directly vaporizing it from a solid (polymer) without via a liquid, the surface tension does not work for the substrate structure as in the supercritical cleaning technology, whereby collapse of the pattern can be prevented.

Decomposition and removal of the resin (A) in Step (3) is preferably carried out by heating at 50° C. or higher and 300° C. or lower. When such a temperature is employed, decomposition and removal of the resin (A) can be certainly carried out while suppressing falling or collapse of the pattern.

As mentioned above, according to the method for cleaning and drying the semiconductor substrate of the present invention, particularly in a substrate onto which a pattern with a high aspect ratio of 10:1 or more has been formed, falling or collapse of the pattern occurring at the time of drying the cleaning solution after cleaning the substrate can be effectively suppressed, and the cleaning solution can be efficiently removed, without using a specific apparatus such as supercritical cleaning. As a result, a semiconductor substrate in which there is neither falling nor collapse of the pattern and fine particles or stain has been removed by cleaning can be obtained.

EXAMPLES

In the following, the present invention is explained in more detail by referring to Examples and Comparative Examples, but the present invention is not limited by these.

Incidentally, the measurement of the molecular weight was specifically carried out by the following method.

A weight average molecular weight (Mw) and a number average molecular weight (Mn) were obtained in terms of polystyrenes by gel permeation chromatography (GPC) using tetrahydrofuran as an eluent, and a dispersity (Mw/Mn) was obtained therefrom.

Also, a weight loss ratio between 30° C. and 250° C. was obtained by using a differential thermal balance under helium atmosphere with the condition of a temperature raising rate of 10° C./min, and subjecting to thermogravimetry (TG).

Synthesis Examples

Synthesis of Heat-Decomposable Polymer Having Acetal Structure

Synthesis Example 1

Synthesis of Heat-Decomposable Polymer (A1) (the Following Formula)

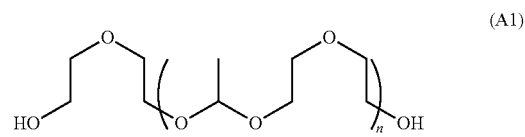

To a mixture comprising 3.8 g of a cation exchange resin (Amberlyst (Registered Trademark) 15) and 100 g of ethyl acetate was added 100 g of diethylene glycol monovinyl ether at room temperature, and the mixture was further stirred for 3 hours. The reaction was stopped by adding 0.8 g of triethylamine, and the cation exchange resin was removed by filtration. The filtrate was concentrated under reduced pressure to obtain 100 g of a polymer (A1) as a high viscous liquid. When the molecular weight and the dispersity were obtained, they were Mw=5,200 and Mw/Mn=2.64. Also, the weight loss ratio of the heat-decomposable polymer (A1) between the temperatures of 30° C. and 250° C. was 93% by mass.

$^1$H-NMR and $^{13}$C-NMR analytical results of the synthesized heat-decomposable polymer (A1) are shown below.

$^1$H-NMR (600 MHz in DMSO-$d_6$):

δ=1.78 (51H, d, J=5.1 Hz), 3.40-3.65 (136H, m), 4.52 (2H, t, J=5.5 Hz), 4.70 (17H, q, H=5.1 Hz)

From the above-mentioned $^1$H-NMR analytical result, "n" was obtained to be 17.

$^{13}$C-NMR (150 MHz in DMSO-$d_6$):

δ=19.60, 60.23, 64.04, 69.88, 72.33, 99.29

Synthesis Example 2

Synthesis of Heat-Decomposable Polymer (A2) (the Following Formula)

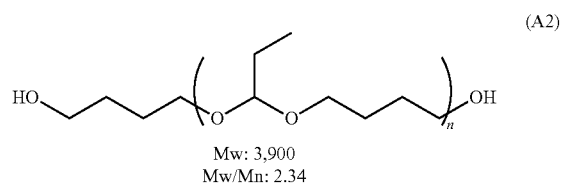

Mw: 3,900
Mw/Mn: 2.34

A heat-decomposable polymer (A2) was synthesized in accordance with the method of (Synthesis Example 1) except for changing the species of the starting materials.

Incidentally, the weight loss ratio of the heat-decomposable polymer (A2) between the temperatures of 30° C. and 250° C. was 95% by mass.

Synthesis Example 3

Synthesis of Heat-Decomposable Polymer (A3) (the Following Formula)

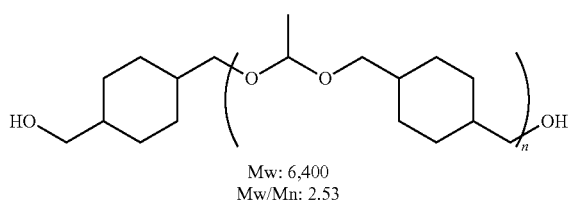

(A3)

Mw: 6,400
Mw/Mn: 2.53

A heat-decomposable polymer (A3) was synthesized in accordance with the method of (Synthesis Example 1) except for changing the species of the starting materials. Incidentally, the weight loss ratio of the heat-decomposable polymer (A3) between the temperatures of 30° C. and 250° C. was 80% by mass.

Example 1

In the following Examples 1 to 3, cleaning and drying of the substrate were carried out by the method shown in the above-mentioned FIG. 1.

Onto a Si substrate was formed a columnar shaped processed pattern containing $SiO_2$ and having an aspect ratio shown in Table 1 by dry etching. Into the substrate was impregnated the cleaning solution (water or isopropyl alcohol (IPA)) shown in Table 2 to prepare a substrate in a state of before drying. Onto the substrate was dropped 10 ml of a solution comprising 50% of propylene glycol methyl ether acetate (in the following, it is referred to as PGMEA) containing 5% of the heat-decomposable polymer (A1) (a polymer) synthesized in Synthesis Example 1, and 50% of propylene glycol monomethyl ether (in the following, it is referred to as PGME), followed by spin coating, and it was baked at 100° C.

As a result, the polymer was filled between the gaps of the substrate patterns, and no collapse of the processed pattern was observed. Subsequently, the substrate was heated at 200° C., then, all the polymers filled between the gaps were decomposed and vaporized and no polymer was observed between the gaps of the processed pattern, and no falling of the processed pattern was observed. The examples in which a combination of the pattern and the cleaning solution was changed are called as Example 1-1 to 1-6, respectively, and the results are shown in Table 2.

TABLE 1

| Pattern | Height | Diameter | Aspect ratio |
|---|---|---|---|
| 1 | 1,000 nm | 100 nm | 10:1 |
| 2 | 1,000 nm | 50 nm | 20:1 |
| 3 | 2,500 nm | 50 nm | 50:1 |

TABLE 2

| Example | Pattern | Cleaning solution | Pattern shape after filling polymer | Pattern shape after removal of polymer by heat decomposition |
|---|---|---|---|---|
| 1-1 | 1 | Water | No falling | Neither falling nor collapse |
| 1-2 | 1 | IPA | No falling | Neither falling nor collapse |
| 1-3 | 2 | Water | No falling | Neither falling nor collapse |
| 1-4 | 2 | IPA | No falling | Neither falling nor collapse |
| 1-5 | 3 | Water | No falling | Neither falling nor collapse |
| 1-6 | 3 | IPA | No falling | Neither falling nor collapse |

Example 2

By using the heat-decomposable polymer (A2) synthesized in Synthesis Example 2, removal of the cleaning solution and drying of the substrate were carried out in the same manner as in Example 1. The examples in which a combination of the pattern and the cleaning solution was changed are called as Examples 2-1 to 2-6, respectively, and the results are shown in Table 3.

TABLE 3

| Example | Pattern | Cleaning solution | Pattern shape after filling polymer | Pattern shape after removal of polymer by heat decomposition |
|---|---|---|---|---|
| 2-1 | 1 | Water | No falling | Neither falling nor collapse |
| 2-2 | 1 | IPA | No falling | Neither falling nor collapse |
| 2-3 | 2 | Water | No falling | Neither falling nor collapse |
| 2-4 | 2 | IPA | No falling | Neither falling nor collapse |
| 2-5 | 3 | Water | No falling | Neither falling nor collapse |
| 2-6 | 3 | IPA | No falling | Neither falling nor collapse |

Example 3

To 100 g of a solution comprising 50% of PGMEA containing 5% of the heat-decomposable polymer (A3) (a polymer) synthesized in Synthesis Example 3, and 50% of propylene glycol monomethyl ether (PGEE), was added 0.05 g of an acid generator shown below, and completely dissolved. To a substrate same as that used in Example 1 was dropped 10 ml of the solution, followed by spin coating, and it was baked at 100° C.

As a result, the polymer was filled between the gaps of the substrate patterns, and no collapse of the processed pattern was observed. Subsequently, the substrate was heated at 150° C., then, all the polymers filled between the gaps were decomposed and vaporized and no polymer was observed between the gaps of the processed pattern, and no falling of the processed pattern was observed. The examples in which a combination of the pattern and the cleaning solution was changed are called as Example 3-1 to 3-6, respectively, and the results are shown in Table 4.

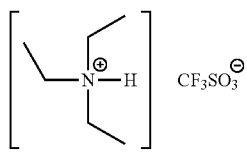

TABLE 4

| Example | Pattern | Cleaning solution | Pattern shape after filling polymer | Pattern shape after removal of polymer by heat decomposition |
|---|---|---|---|---|
| 3-1 | 1 | Water | No falling | Neither falling nor collapse |
| 3-2 | 1 | IPA | No falling | Neither falling nor collapse |
| 3-3 | 2 | Water | No falling | Neither falling nor collapse |
| 3-4 | 2 | IPA | No falling | Neither falling nor collapse |
| 3-5 | 3 | Water | No falling | Neither falling nor collapse |
| 3-6 | 3 | IPA | No falling | Neither falling nor collapse |

Comparative Example 1

Figure 2:
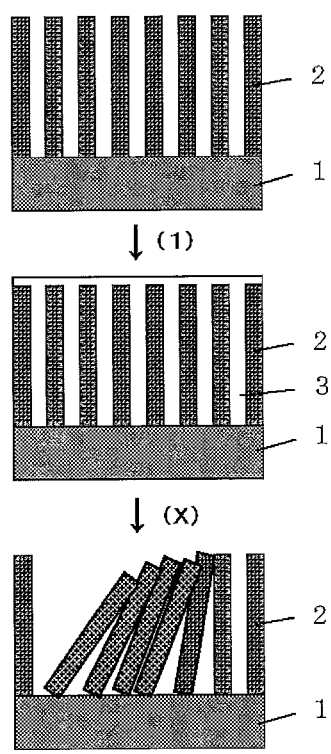
FIG. 2 is a flow chart showing a method for cleaning and drying the semiconductor substrate of Comparative Example.

In Comparative Example 1, cleaning and drying were carried out by the method shown in FIG. 2.

The method for cleaning and drying in FIG. 2 is a method in which a semiconductor substrate 1 onto which a pattern 2 has been formed is cleaned by a cleaning solution 3 as Step (1), and the cleaning solution is dried by heating without substituting by a composition solution of a heat-decomposable polymer as Step (X).

This is explained in more detail in the following. Onto a Si substrate was formed a columnar shaped processed pattern containing $SiO_2$ and having an aspect ratio shown in Table 1 by dry etching. Into the substrate was impregnated the cleaning solution (water or IPA) shown in Table 5, and the substrate was baked at 100° C. without substituting by a composition solution of a heat-decomposable polymer. Further, when the substrate was heated at 200° C., falling of the processed pattern was observed. The examples in which a combination of the pattern and the cleaning solution was changed are called as Comparative Examples 1-1 to 1-6, respectively, and the results are shown in Table 5.

TABLE 5

| Comparative Example | Pattern | Cleaning solution | Pattern shape after drying |
|---|---|---|---|
| 1-1 | 1 | Water | Falling was observed |
| 1-2 | 1 | IPA | Falling was observed |
| 1-3 | 2 | Water | Falling was observed |
| 1-4 | 2 | IPA | Falling was observed |
| 1-5 | 3 | Water | Falling was observed |
| 1-6 | 3 | IPA | Falling was observed |

As shown in Tables 2 to 4, in Examples 1 to 3 in which the cleaning solution on the substrate was substituted by the composition solution containing the heat-decomposable polymer, no falling of the processed pattern by drying was occurred even in the pattern having an aspect ratio of 50:1.

On the other hand, as shown in Table 5, in Comparative Example 1 in which the cleaning solution was impregnated into the pattern and dried without substituting by the composition solution of the heat-decomposable polymer, falling of the processed pattern was occurred even in the pattern having an aspect ratio of 10:1.

From the results as mentioned above, according to the method for cleaning and drying the semiconductor substrate of the present invention, it could be clarified that particularly in a substrate onto which a pattern with a high aspect ratio of 10:1 or more had been formed, falling or collapse of the pattern occurring at the time of drying the cleaning solution after cleaning the substrate could be effectively suppressed, and the cleaning solution could be efficiently removed, without using a specific apparatus such as supercritical cleaning.

It must be stated here that the present invention is not restricted to the embodiments shown above. The embodiments shown above are merely examples so that any embodiments composed of substantially the same technical concept as disclosed in the claims of the present invention and expressing a similar effect are included in the technical scope of the present invention.

What is claimed is:

1. A method for cleaning and drying a semiconductor substrate in which a semiconductor substrate onto which a pattern has been formed is cleaned and dried, which comprises steps of
   (1) cleaning with a cleaning solution the semiconductor substrate onto which a pattern has been formed,
   (2) drying the cleaned semiconductor substrate, wherein this step (2) includes stages (2-1) and (2-2):
      (2-1) substituting the cleaning solution with a composition solution containing a resin (A) which is decomposed by either or both of an acid and heat, and
      (2-2) decomposing and removing the resin (A) by either or both of an acid and heat.

2. The method for cleaning and drying a semiconductor substrate according to claim 1, wherein the resin (A) contains a repeating unit having an acetal structure represented by the following general formula (1),

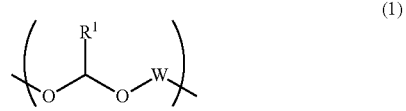

wherein $R^1$ represents a hydrogen atom, or a saturated or unsaturated monovalent organic group having 1 to 30 carbon atoms which may be optionally substituted; and W represents a saturated or unsaturated divalent organic group having 2 to 30 carbon atoms.

3. The method for cleaning and drying a semiconductor substrate according to claim 2, wherein the resin (A) is a compound represented by any of the following general formulae (1a) to (1c),

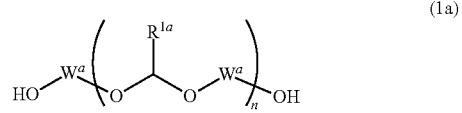

-continued

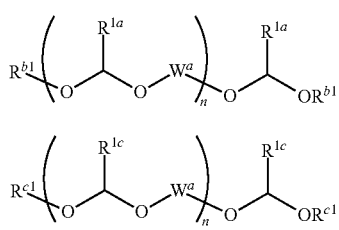

wherein $R^{1a}$ represents an alkyl group having 1 to 4 carbon atoms; $W^a$ represents a saturated or unsaturated divalent hydrocarbon group having 4 to 10 carbon atoms which may contain an ether bond(s); each $R^{b1}$ independently represents —$W^a$—OH, or a saturated or unsaturated monovalent organic group having 1 to 30 carbon atoms which may be optionally substituted; $R^{1c}$ represents a hydrogen atom, an aryl group having 6 to 20 carbon atoms which may be optionally substituted, or a heteroaryl group having 4 to 20 carbon atoms which may be optionally substituted; each $R^{c1}$ independently represents an alkyl group having 1 to 4 carbon atoms or —$W^a$—OH; and "n" represents an average number of repeating units and is 3 to 2,000.

4. The method for cleaning and drying a semiconductor substrate according to claim 1, wherein an aspect ratio of the pattern is 10:1 or more.

5. The method for cleaning and drying a semiconductor substrate according to claim 2, wherein an aspect ratio of the pattern is 10:1 or more.

6. The method for cleaning and drying a semiconductor substrate according to claim 3, wherein an aspect ratio of the pattern is 10:1 or more.

7. The method for cleaning and drying a semiconductor substrate according to claim 1, wherein the cleaning solution is a liquid containing one or more of water, a water-soluble alcohol, and a fluorine compound.

8. The method for cleaning and drying a semiconductor substrate according to claim 2, wherein the cleaning solution is a liquid containing one or more of water, a water-soluble alcohol, and a fluorine compound.

9. The method for cleaning and drying a semiconductor substrate according to claim 3, wherein the cleaning solution is a liquid containing one or more of water, a water-soluble alcohol, and a fluorine compound.

10. The method for cleaning and drying a semiconductor substrate according to claim 4, wherein the cleaning solution is a liquid containing one or more of water, a water-soluble alcohol, and a fluorine compound.

11. The method for cleaning and drying a semiconductor substrate according to claim 1, wherein decomposition and removal of the resin (A) is carried out by heating at 50° C. or higher and 300° C. or lower.

12. The method for cleaning and drying a semiconductor substrate according to claim 2, wherein decomposition and removal of the resin (A) is carried out by heating at 50° C. or higher and 300° C. or lower.

13. The method for cleaning and drying a semiconductor substrate according to claim 3, wherein decomposition and removal of the resin (A) is carried out by heating at 50° C. or higher and 300° C. or lower.

14. The method for cleaning and drying a semiconductor substrate according to claim 4, wherein decomposition and removal of the resin (A) is carried out by heating at 50° C. or higher and 300° C. or lower.

15. The method for cleaning and drying a semiconductor substrate according to claim 7, wherein decomposition and removal of the resin (A) is carried out by heating at 50° C. or higher and 300° C. or lower.

16. The method for cleaning and drying a semiconductor substrate according to claim 1, which comprises a stage of (2-1') removing the solvent in the substituted composition solution, after the stage (2-1) and before the stage (2-2).

17. The method for cleaning and drying a semiconductor substrate according to claim 2, which comprises a stage of (2-1') removing the solvent in the substituted composition solution, after the stage (2-1) and before the stage (2-2).

18. The method for cleaning and drying a semiconductor substrate according to claim 3, which comprises a stage of (2-1') removing the solvent in the substituted composition solution, after the stage (2-1) and before the stage (2-2).

19. The method for cleaning and drying a semiconductor substrate according to claim 4, which comprises a stage of (2-1') removing the solvent in the substituted composition solution, after the stage (2-1) and before the stage (2-2).

20. The method for cleaning and drying a semiconductor substrate according to claim 7, which comprises a stage of (2-1') removing the solvent in the substituted composition solution, after the stage (2-1) and before the stage (2-2).

* * * * *